United States Patent [19]

Goldstein

[11] Patent Number: 5,278,512
[45] Date of Patent: Jan. 11, 1994

[54] APPARATUS AND METHOD FOR CONTINUOUSLY MONITORING GROUNDING CONDUCTOR RESISTANCE IN POWER DISTRIBUTION SYSTEMS

[76] Inventor: Richard Goldstein, 632 Hospitality Dr., Rancho Mirage, Calif. 92270

[21] Appl. No.: 883,654

[22] Filed: May 15, 1992

[51] Int. Cl.$^5$ .................. G01R 31/14; G01R 27/26
[52] U.S. Cl. .................. 324/509; 324/708; 324/711
[58] Field of Search ........... 324/509, 708, 603, 711, 324/676–678, 525

[56] References Cited

U.S. PATENT DOCUMENTS

| | | | |
|---|---|---|---|
| 2,601,491 | 6/1952 | Baker | 175/183 |
| 2,988,709 | 6/1961 | Janssen | 331/112 |
| 3,234,461 | 2/1966 | Trent et al. | 324/62 |
| 3,544,893 | 12/1970 | Savin et al. | 324/62 |
| 3,810,003 | 5/1974 | Portoulas | 324/51 |
| 3,990,040 | 11/1976 | Gleitz et al. | 340/52 H |
| 4,242,631 | 12/1980 | Hall | 324/62 |
| 4,362,988 | 12/1982 | Weimer | 324/62 |
| 4,386,338 | 5/1983 | Doyle et al. | 340/310 A |
| 4,446,427 | 5/1984 | Lovrenich | 324/207 |
| 4,518,945 | 5/1985 | Doyle et al. | 340/310 A |
| 4,568,997 | 2/1986 | Bienwald et al. | 361/45 |
| 4,595,894 | 6/1986 | Doyle et al. | 335/18 |
| 4,808,911 | 2/1989 | Oaks | 324/57 Q |
| 4,810,950 | 3/1989 | Young | 324/57 PS |
| 4,958,131 | 9/1990 | Thorn | 324/708 |
| 4,973,912 | 11/1990 | Kaminski et al. | 324/652 |

OTHER PUBLICATIONS

ECOS ®, Ground Check TM, Specifications.
W. A. Moncrief, *Outlet Testers Save Equipment,* Power Quality, pp. 24–25 (Mar./Apr. 1991).
News Release, Smart Static Ground TM Monitor, Pilgrim Electric Company.
Kujala and Pettersson, LAN Power Quality Problem Solutions Require Attention to Grounding and Transients, Power Quality, pp. 20–24 (Sep./Oct. 1991).

*Primary Examiner*—Kenneth A. Wieder
*Assistant Examiner*—Maura K. Regan
*Attorney, Agent, or Firm*—Wallenstein, Wagner & Hattis, Ltd.

[57] ABSTRACT

A method and apparatus is disclosed for continuously monitoring the resistance of a grounding conductor to neutral conductor circuit of a power distribution system. The apparatus compares a parameter of a damped sinusoidal waveform from a shock excited resonant circuit coupled to the grounding conductor and neutral conductor at a branch circuit outlet of the power distribution system with a predetermined parameter from the same resonant circuit discharging into an external circuit having a predetermined resistance. The apparatus indicates an undesired grounding conductor resistance.

25 Claims, 7 Drawing Sheets

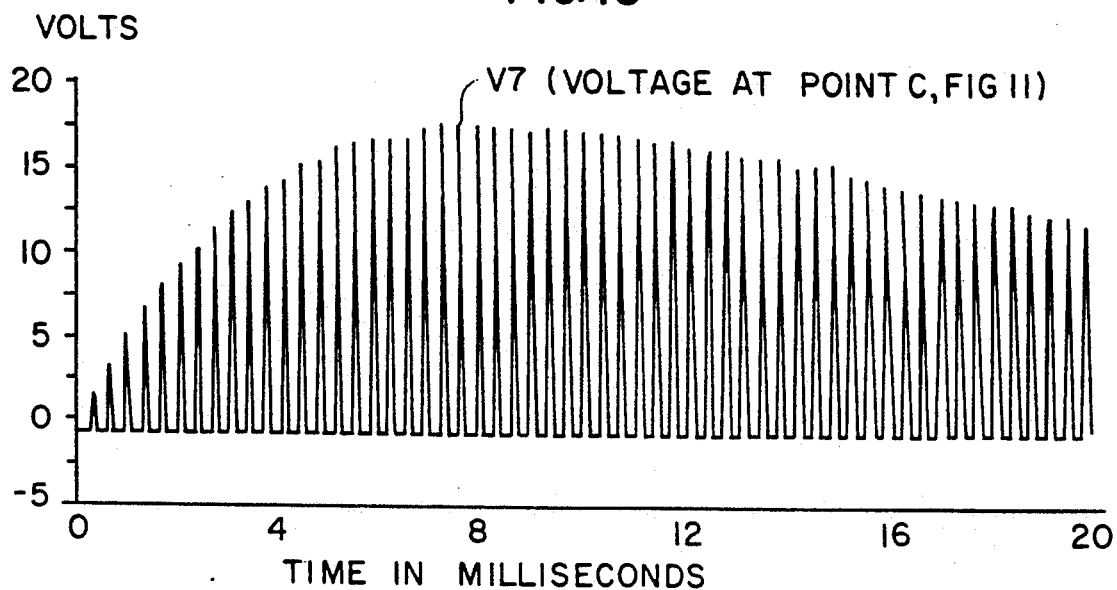
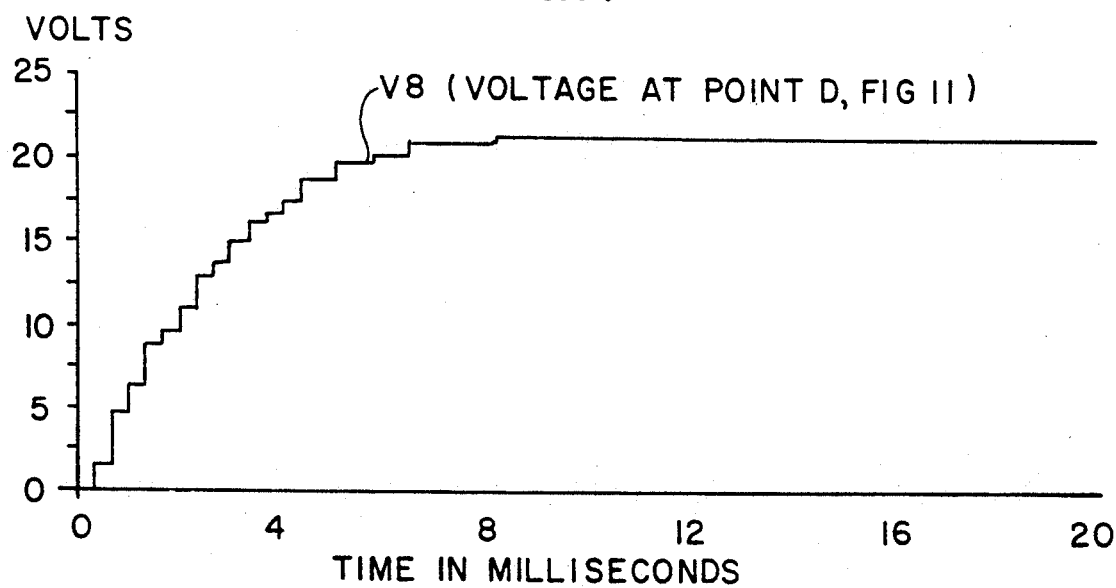

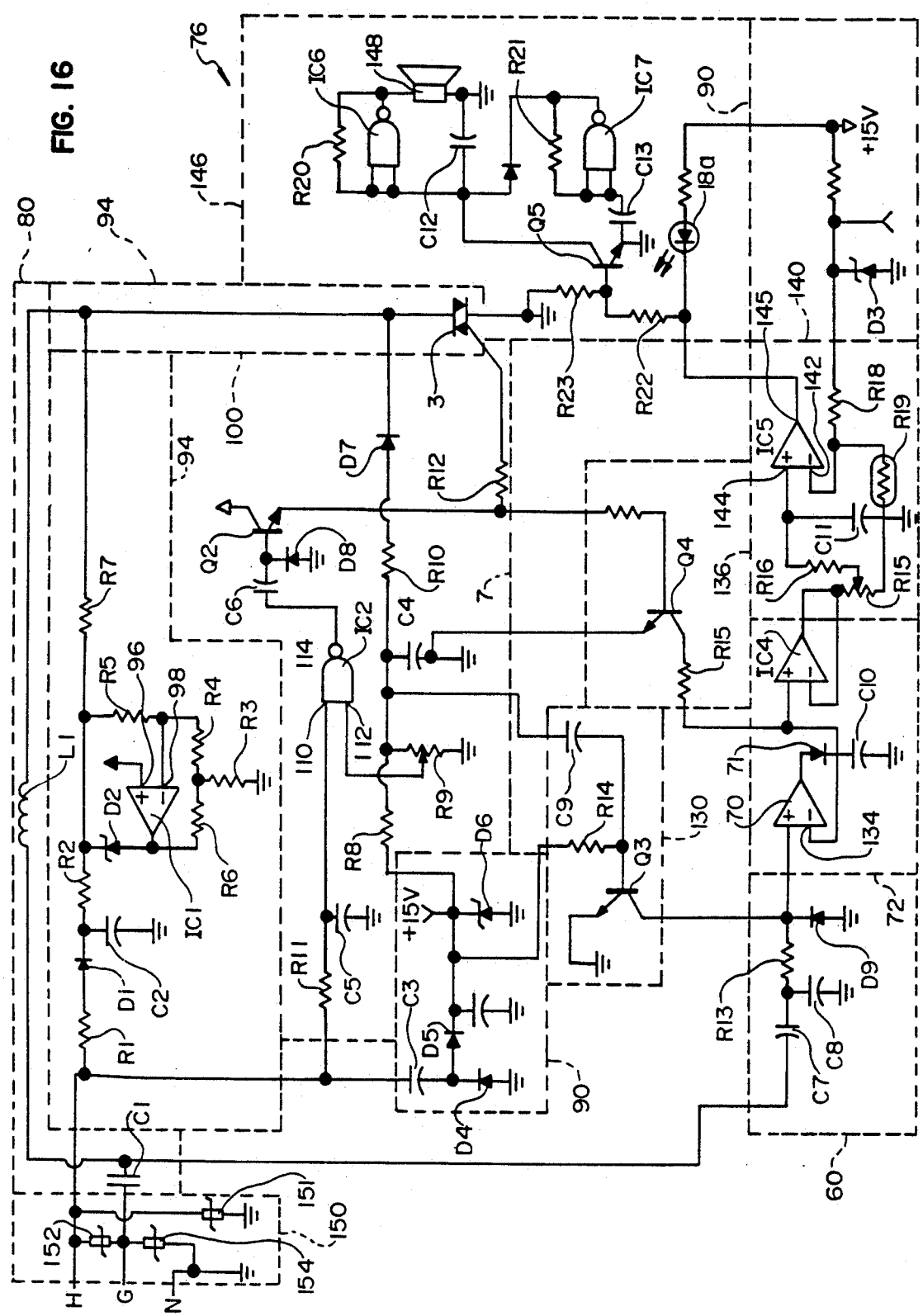

APPARATUS AND METHOD FOR CONTINUOUSLY MONITORING GROUNDING CONDUCTOR RESISTANCE IN POWER DISTRIBUTION SYSTEMS

TECHNICAL FIELD

This invention relates to a method and apparatus for measuring small resistances. They have their most useful application in a continuous grounding conductor resistance monitoring system which analyzes the resistance measured between the grounding and neutral conductors of a power distribution system.

BACKGROUND PRIOR ART

Improper grounding of power distribution systems can have adverse effects upon the performance and maintenance of complex telecommunications systems, computer networking systems, and other electronic equipment. Such power distribution systems commonly consist of 120 volt, 60 hertz alternating current supplies in the U.S. and other western hemisphere countries, and 220 volt, 50 and 60 hertz supplies in Europe.

The power distribution systems which provide power to telephone switchboards, personal computers, facsimile machines, copy machines and other equipment are typically single phase, three conductor systems. Two of the conductors, a "high potential" or "hot" conductor and a "neutral" conductor, are current carrying. The third conductor, a "grounding" conductor, is typically bonded to the neutral conductor at the main service entrance of a building or at a major power distribution panel. At this point, the neutral and grounding conductors are also bonded to an "earth ground", which is typically a copper rod driven into the earth. Therefore, substantially no voltage should exist between the neutral conductor and any other conductor which is connected to earth, such as water pipes, metallic building structures, ventilating ducts, etc. The hot conductor will have a voltage potential with respect to such objects equal to the rated supply voltage.

In the United States, the National Electrical Code and the standards of Underwriters Laboratories (U.L.), and their counterparts in virtually all other countries, require that the metallic enclosures of any electrical utilization equipment be firmly bonded to the grounding conductor of a power distribution system.

A variety of "power protection" devices have been developed to safeguard electronic equipment from damage or system malfunction resulting from problems with the power distribution system. Among these are standby power supplies to supply power in the event of a power outage or malfunction. Other devices protect against transient voltage surges caused by lightning and power switching phenomena, or filter out high frequency "noise". Voltage regulators keep supply voltage within safe operating range for the equipment in the event of voltage sags or swells (i.e. surges) in the power distribution system.

Another problem associated with the power distribution system occurs when the resistance of the grounding conductor becomes unreasonably high. This may result from deterioration of the grounding conductor. Such deterioration can result from a number of causes including physical damage to the electrical conduit from construction work or impact of material handling equipment, slow deterioration from rust or exposure to corrosive chemicals, or loose connections caused by vibration or constant bumping of floor outlets by cleaning equipment. These problem do not usually occur with the neutral conductor which is protected by an outer casing. Therefore, the monitoring of the resistance between the neutral and grounding conductor is usually a good indication of the condition of the grounding conductor.

It is well accepted in the telecommunications and computer networking environment that a low resistance grounding system is a practical necessity. The connection of data lines between computers or other equipment which are separated by a considerable distance requires that the separated units be powered from different branch circuits in the power distribution system. If the "local" grounding conductors are at different potentials with respect to earth, the potential difference can be combined with data signals between the equipment to cause data errors or even damage to sensitive electronic devices driving and receiving the data signals Therefore, good installation practice stresses the importance of having lo resistance grounding conductors from each equipment site to a common earth point in the power distribution system.

The resistance of the ground path for a particular power distribution system branch circuit can be verified by measuring the resistance between the neutral and grounding conductors at an outlet of the branch circuit. Typically, this measurement may require that the power be shut-off to that branch circuit because a low resistance ohmmeter can be disturbed by line noise or voltage between the neutral and grounding conductors.

Other prior art methods of testing the condition of the grounding conductor have employed an indicator circuit connected between the hot conductor and the grounding conductor. To comply with U.L. shock hazard leakage requirements, the impedance of such circuits is necessarily high. Therefore, a grounding conductor path that is also a fairly high resistance will still indicate a satisfactory grounding conductor. Most such indicator circuits will show a satisfactory ground with a grounding conductor's path resistance of tens of thousands of ohms. All such circuits will indicate a satisfactory ground with resistance as high as 1000 ohms.

U.S. Pat. No. 3,810,003 discloses a technique for determining resistance of the grounding conductor path by measurement made at a power distribution system branch circuit outlet. The measurement is accomplished by intermittently pulsing a fairly high current (about 10 amperes) through the grounding conductor (i.e. a deliberate ground-fault current). The current flows through the hot conductor and the grounding conductor. The voltage drop through the grounding conductor can then be measured at the outlet between the neutral and grounding conductors. Since no pulse current is flowing in the neutral conductor, it will be at the potential of the junction of the neutral and grounding conductor at a power distribution panel. At the outlet, the potential of the grounding conductor will be raised by the voltage drop through the grounding conductor caused by the current pulse. Thus, the resistance of the grounding conductor can be measured utilizing the relationship $R = V/I$. This technique can be used to test the grounding conductor resistance. However, while proposals have been made of utilizing this device to continuously monitor the resistance of a grounding conductor, neither it nor an ohmmeter can be used as a continuous monitoring device since neither can meet the U.L. leakage current safety requirement of 3.5 milliamperes. This leakage requirement is the maximum current which may flow between the grounding and neutral conductors in the event such conductors are accidentally reversed at an outlet.

Moreover, the 3.5 milliampere leakage current limit is too low to make that current useful for detecting a variation of several ohms in the current path because it would require resolving a voltage change of the order of 10 millivolts. This is impractical because there is always some voltage appearing between the neutral and grounding conductors from noise, transient surges or load-current drop in the resistance of the neutral conductor. For instance, a 1000 watt, 70% power factor typical computer load can result in peak current through the neutral conductor of over 30 amperes. This would cause a 3 volt drop in the neutral conductor with a resistance of only 0.1 ohm. Since this voltage is added to the small measuring current voltage drop in the grounding conductor, it would obscure the 10 millivolt or less change that must be detected. Thus, a monitoring device which measures the voltage drop through the grounding conductor and is confined to the branch circuit outlet to be monitored, cannot operate within the applicable safety standards.

U.S. Pat. No. 4,973,912 discloses a method and device for contactless measurement of resistance arranged in the secondary circuit of a transformer. The time constant for a decaying sinusoidal response is employed to determine a value of an unknown resistance. The device comprises an excitation circuit for exciting a tuned circuit containing an unknown resistance to be measured and a time constant waveform analyzer to determine the time constant of the resulting response to the excitation signal. The patent suggests that various methods may be employed to measure the time constant. However, a method of counting the peaks of the decaying sinusoidal response until the voltage reaches a certain value is specifically taught. The device is utilized to monitor the resistance of the firing cap of the automotive airbag system located in the steering wheel of the vehicle. There is no teaching or suggestion that this device is useful as a monitoring apparatus for the grounding to neutral circuit resistance of a power distribution system or how it could be associated with the hot, grounding and neutral conductors of such a system.

The unique method of the present invention can continuously and reliably monitor the resistance of a grounding conductor while coupled to a power distribution system circuit. Furthermore, this method may be embodied in an apparatus which complies with the applicable safety U.L. and other standards.

SUMMARY OF THE INVENTION

In the most useful application of the invention, namely one for continuously monitoring the resistance of the grounding to neutral conductor circuit in a power distribution system, the preferred form of the monitoring apparatus is connected through a plug connection to a three terminal outlet socket of a commercial power distribution system branch circuit. These terminals respectively connect with the grounding, hot and neutral conductors of the power distribution system. The apparatus may include a housing having additional outlet sockets to which a variety of electrical equipment may then be plugged. Alternatively, the apparatus of the present invention may be directly incorporated into such electrical equipment, such as a personal computer, surge suppressor, voltage regulator, or standby power supply.

The apparatus includes an LC resonant circuit, which is coupled through the plug connector to the grounding and neutral conductors of the power distribution system. The resonant circuit is periodically shock excited with electrical energy preferably from a DC voltage regulated power supply circuit energized from the hot conductor of the power distribution system. The charge may be, for instance, the voltage charged on the capacitor or current in the inductor of the resonant circuit. The DC power supply source is then disconnected from the resonant circuit and a switch closed so that the energy stored in the circuit is allowed to discharge through the grounding and neutral conductors of the power distribution system. The discharging energy provides a damped sinusoidal voltage or current waveform before the next charge is applied. The damping effect on the waveform is responsive to the resistance in the grounding and neutral conductors of the power distribution system in series with the LC resonant circuit in addition to the effective resistance of the resonant circuit source.

While each waveform is decaying, a parameter of the damped sinusoidal waveform responsive to the resistance is sampled. A circuit then compares this parameter to a predetermined parameter of a waveform produced by this resonant circuit with a predetermined additional external limit resistance. In this manner, the device can utilize the sampled parameter to monitor the resistance added externally to the resonant circuit.

When this resistance exceeds a predetermined value, a circuit for indicating this state is activated. The indicating circuit preferably may include a buzzer and a light or other means for indicating that the grounding conductor's resistance value has exceeded the predetermined value. When utilized to monitor the electrical supply of a personal computer, the computer may also display a warning message In accordance with a specific, preferred aspect of the invention, the parameter which is compared is a function of the amplitude of the decaying waveform at a point in time where that amplitude is most sensitive to resistance changes. Preferably, this parameter could be the peak amplitude of a modified form of the decaying waveform at a time which is most sensitive to small changes in the resistance of an external circuit into which the resonant circuit discharges its stored energy when the external circuit resistance is equal to the value at which the alarm is to be activated. It will be shown later that this time is in the vicinity of one time constant of the damped sinewave. This most unique aspect of this sampling circuit may be employed to measure, test or monitor any small resistance and so is not limited to monitoring the grounding to neutral conduction resistance of a power distribution system.

In accordance with another aspect of the invention used in a grounding conductor resistance measuring system, the LC resonant circuit is shock excited when the AC voltage in the hot conductor is at or near zero and the damped waveform is sampled when the AC voltage is also at or near zero. This is to reduce any measurement errors which may arise from voltage between the neutral and grounding conductors as a result of the AC voltage. The reliability of the monitoring apparatus is further increased by using a resonant circuit frequency much higher than power line frequency but low enough to reduce the effects of inductive reactance of the grounding to neutral conductors to a value which is a small fraction of the value of the resistance to be monitored so as not to substantially effect the accuracy of the resistance to be indicated. Also, this frequency is preferably low enough so that transformer action caused by magnetic coupling between the neutral conductor and other conductors contained in the same conduit will not introduce series equivalent resistance into the neutral conductor greater than a small fraction of the value of the limit resistance to be monitored so as not to substantially affect the accuracy of the resistance indicated. By small fraction is meant a ratio of about 1/10.

Also, very high quality inductance and capacitance elements are preferably utilized which have an effective resistance of no greater than about 5-10 times the resistance of an acceptable grounding conductor resistance (e.g., 1-2 ohms).

Other features of the invention which relate to other details of preferred forms of the invention are described in the specifications and claims to follow and shown in the drawings.

BRIEF DESCRIPTION OF DRAWINGS

FIG. 13 is the voltage at point C in the circuit of FIG. 11;

FIG. 14 is the voltage at point D in the circuit of FIG. 11;

FIG. 16 is a schematic diagram of a complete circuit of the apparatus of FIG. 15.

DETAILED DESCRIPTION OF DRAWINGS

Figure 1:
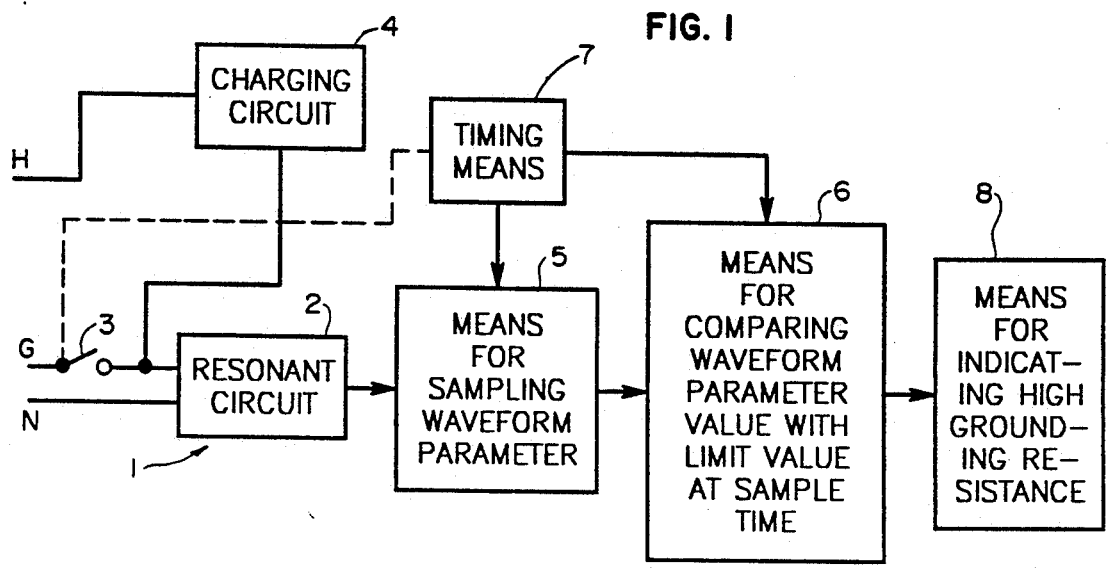
FIG. 1 is a block diagram of a continuous grounding-neutral conductor monitoring system.
Figure 2:
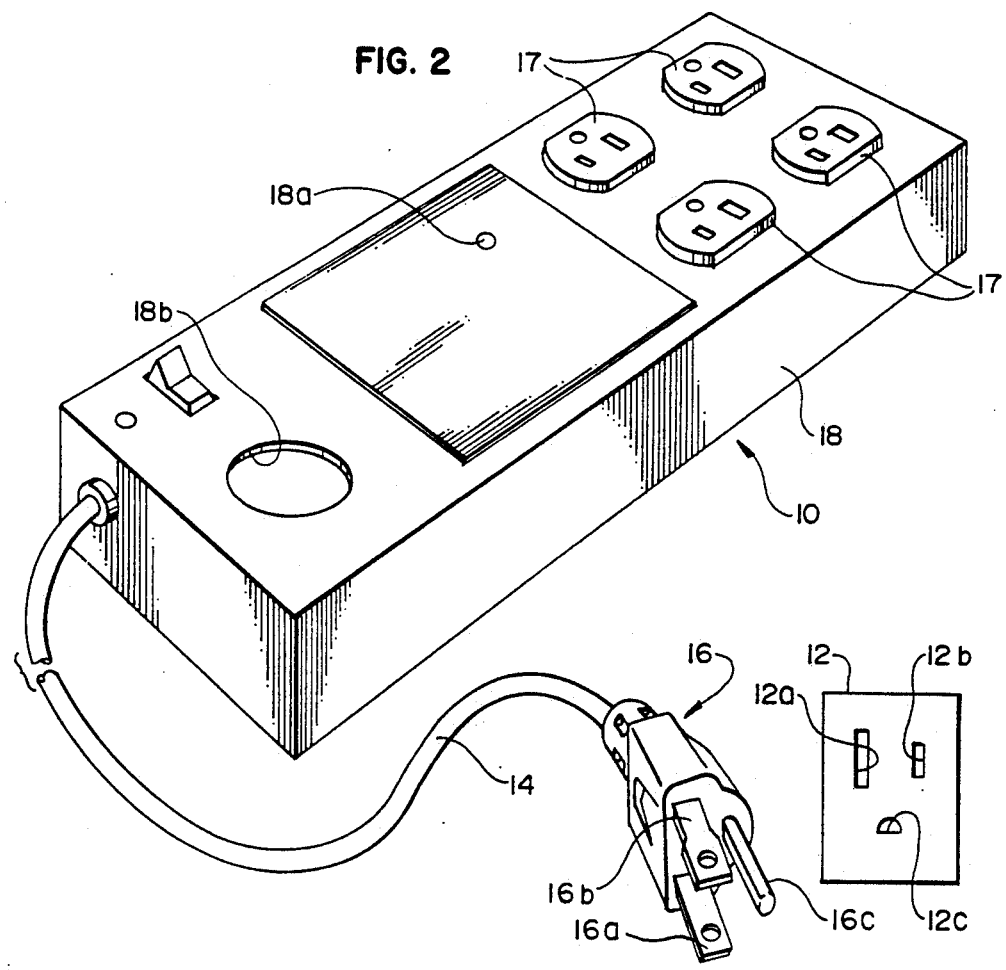
FIG. 2 is a perspective view of an apparatus of the present invention.

FIGS. 1 and 2

A block diagram of a system 1 of the invention for monitoring the resistance of a grounding to neutral conductor circuit of a power distribution system which includes the grounding conductor G, neutral conductor N and a hot conductor H is shown in FIG. 1. A resonant circuit 2, such as a series circuit, is coupled to the grounding G and neutral N conductors of the power distribution system. The monitoring system 1 includes a regulated charging circuit 4 coupled to the hot conductor H and the resonant circuit 2 through the neutral conductor N. The charging circuit 4 periodically under the control of timing means 7 supplies an electrical charge to the resonant circuit 2. Closing switch 3 allows the charge to decay through the grounding and neutral circuit to produce a damped sinusoidal waveform responsive to the resistance of the grounding to neutral circuit. A means 5 for sampling a parameter of the waveform under control of the timing means 7 may be provided coupled to the resonant circuit 2. The sampling time could be under control of the timing means 7. In accordance with a specific feature of the invention no timing means as such is needed because of the use of a unique waveform modifying circuit to be described. A means 6 is coupled to the sampling means 5 for comparing the waveform parameter at a sample time with a predetermined value of a parameter of a waveform having a predetermined limiting value of external resistance. An indicating means 8 for indicating a high grounding to neutral conductor resistance is coupled to the comparing means 6. The indicating means is responsive to the output of the comparing means 6.

The electrical circuitry which constitutes the various means just described may form part an integral unit 10 shown in FIG. 2. This unit 10 is connected to a power distribution system branch circuit outlet socket 12 by a power cord 14 having a 3-prong plug 16 with plug terminals 16a, 16b and 16c. The outlet socket 12 includes socket terminals 12a, 12b and 12c for the grounding, neutral and hot conductors of the system and into which plug terminals 16a, 16b and 16c extend. Electronic equipment (not shown) can then be connected to the outlet sockets 17 positioned on the housing 18 of the monitoring unit 10. In the preferred embodiment, the monitoring apparatus includes four such outlet sockets 17; however, this number may be either increased or decreased as desired by the manufacturer.

The monitoring unit 10 responds to the resistance of the neutral-grounding path at outlet 12. This resistance is measured by detecting its damping effect on a charged or shock excited high Q (low loss) series LC resonant circuit (the "Q" or "quality factor" is a common way of quantifying the losses in a resonant circuit). The resistance of the neutral conductor is included in this measurement. However, unlike the grounding conductor, which is not always securely connected to an outlet, the neutral conductor is protected by an outer casing and is typically secured to the outlet with a high quality connection. Accordingly, the neutral conductor does not normally have a significant change in resistance. Thus, the error resulting from the neutral conductors inclusion is usually sufficiently small that grounding conductor resistance in excess of two ohms can be monitored.

When the unit 10 detects a grounding conductor resistance in excess of a given value, such as 2 ohms, indicator light 18a visible at the top of the housing 18 will become energized and a buzzer alarm mounted behind an aperture 18b in the housing 18 will be sounded to alert the operator to the presence of an unacceptably high grounding conductor resistance monitored by the unit 10.

FIGS. 3-10

A sinusoidal voltage waveform of a shock excited resonant circuit will decay from its initial voltage peak amplitude in an exponential manner. The peak values of the waveform are described by the "envelope" value of the waveform. The envelope of a shock excited resonant circuit will decay from the initial peak value to thirty seven percent of the initial peak value in one time constant of the resonant circuit. The time constant of a series resonant circuit equals $2 \cdot L/R$, where L is the value of the inductance in henries and R is the equivalent series resistance of the circuit in ohms (i.e., R is the effective resistance of the LC resonant circuit plus the resistance of the grounding to neutral conductor circuit). Increasing the resistance R shortens the time constant and increases the dampening effect on the voltage waveform.

Figure 3:
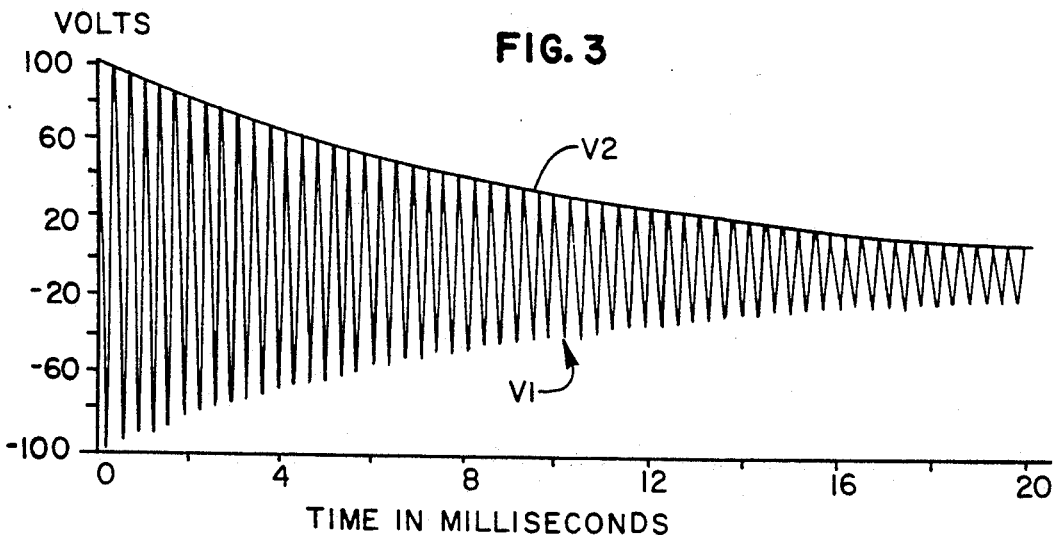
FIG. 3 is the the waveform and positive envelope of a damped sinusoidal voltage waveform of a resonant circuit with respect to time.
Figure 4:
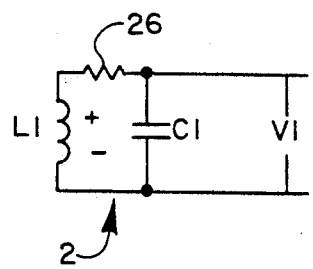
FIG. 4 is a schematic diagram of a resonant circuit for producing the sinusoidal waveform of FIG. 3.
Figure 5:
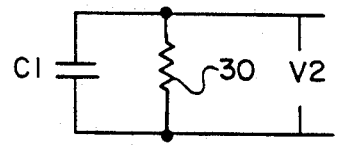
FIG. 5 is a schematic diagram of a circuit for producing a positive peak value envelope for the waveform of FIG. 3.

FIG. 3 shows the voltage versus time waveform V1 across a 0.05 microfarad capacitor C1 of a shock excited resonant circuit 2 of FIG. 4 with an initial value of 100 volts on the capacitor 20. The resonant circuit 2 comprises the capacitor C1, a 60 millihenry inductor L1 and an 11 ohm effective resistance 26. The resistance 26 represents the total circuit resistance of 11 ohms plus an acceptable neutral-grounding circuit resistance of 1 ohm. The positive peak values of the waveform V1 can be represented by the decay in the envelope voltage V2 in a 0.05 microfarad capacitor C1 charged to the same envelope voltage with the same decay constant. Such a circuit which includes the capacitor C1 and a 200 k ohm resistor 30 is shown in FIG. 5. The envelope voltage V2 of this circuit provides a maximum peak value envelope for the voltage waveform V1. The maximum peak values of the waveform V1 decays to 37 volts in one time constant (10 milliseconds for a 12 ohm resistance).

Figure 6:
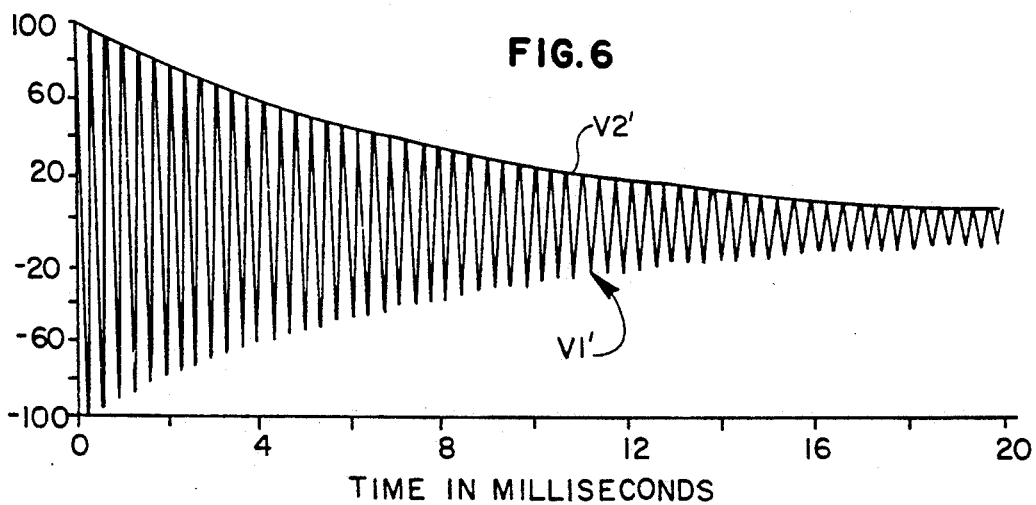
FIG. 6 is the waveform and positive envelope of a damped sinusoidal voltage waveform of a second resonant circuit with respect to time.
Figure 7:
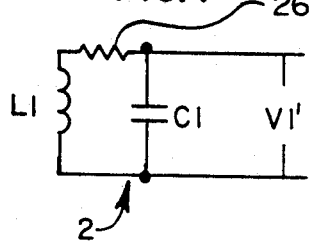
FIG. 7 is a schematic diagram of a second resonant circuit for producing the sinusoidal waveform of FIG. 3.
Figure 8:
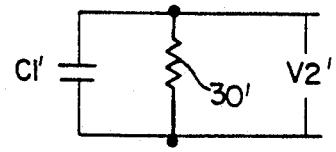
FIG. 8 is a schematic diagram of a second resonant circuit for producing a positive peak value envelope for the waveform of FIG. 6.

FIG. 6 shows a similar waveform V3 for a resonant circuit 22' of FIG. 7. The resonant circuit 2' comprises a 0.05 microfarad capacitor C1, a 60 millihenry inductor L1 and a 15 ohm resistor 26'. An initial voltage of 100 volts is placed on the capacitor C1. By comparing the waveform V1 with the waveform V1', it is apparent that the larger resistance in the resonant circuit 2' has increased the damping effect on the waveform V1'. FIG. 8 shows a circuit for providing a maximum peak value envelope V2' for the resonant circuit 2'. This circuit comprises a 0.05 microfarad capacitor C1 and a 160 k ohm resistor 30'. The time constant for the waveform V2' is 8 milliseconds.

Figure 9:
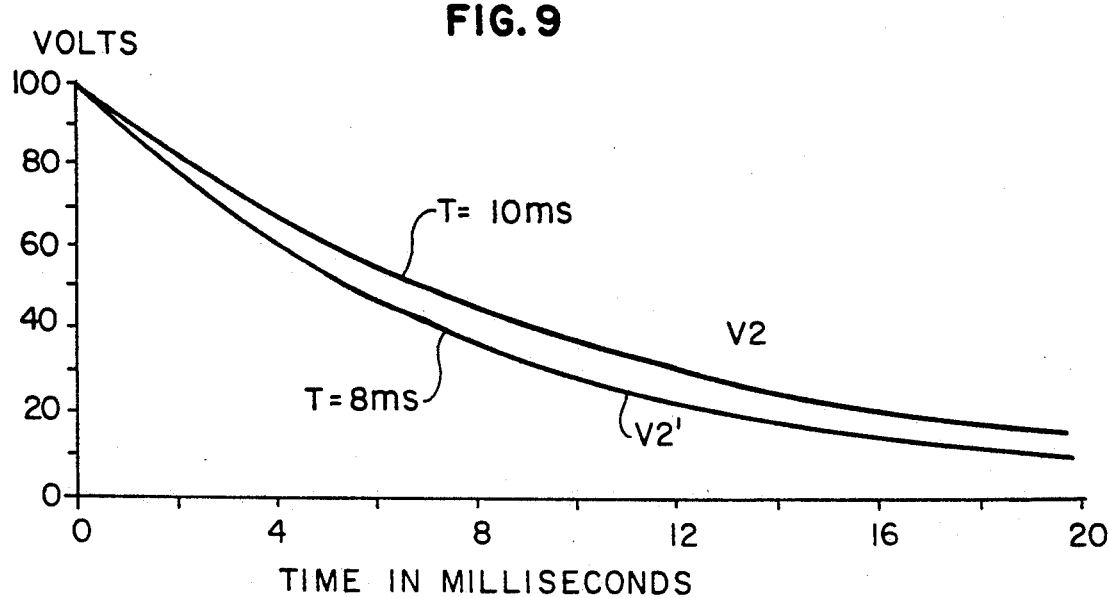
FIG. 9 is the peak value envelopes of FIG. 5 and FIG. 8, on a common scale.
Figure 10:
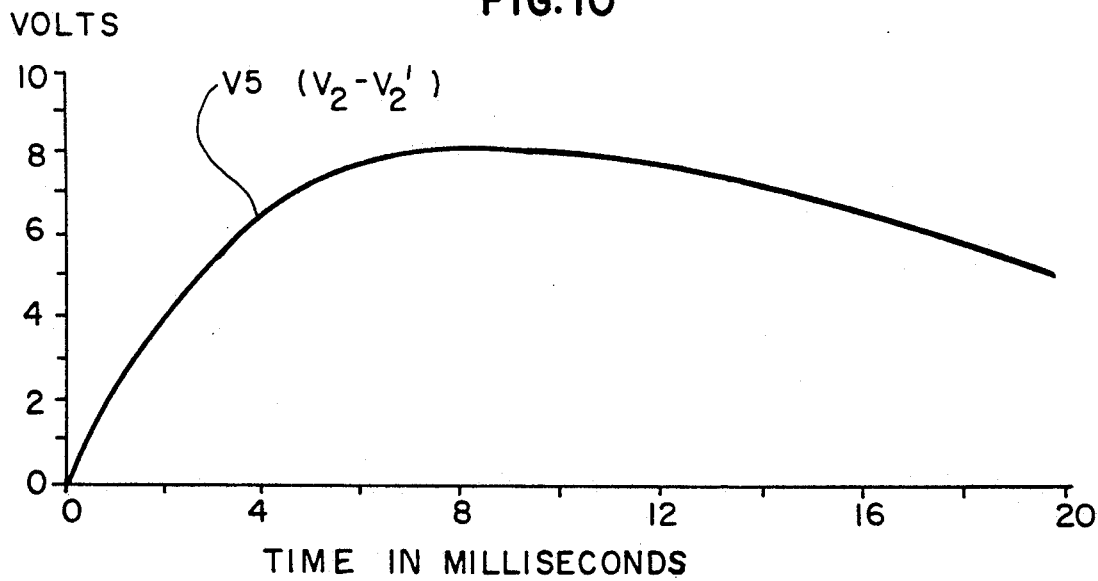
FIG. 10 is the difference of the envelopes of FIG. 5 and FIG. 8 with respect to time.

FIG. 9 shows, on a common scale, the peak envelopes V2 and V2'. FIG. 10 shows the difference voltage V5 versus time for the positive peak envelopes V2 and V2' of FIG. 8 (i.e. V5=V2−V2').

A decaying voltage sinusoidal waveform in a shock excited high Q circuit will have substantially the same initial peak value for differences in the damping factor in the order of 20%. The decaying voltage waveform will have a final value of zero voltage. If one compares the difference of two decaying voltage sinusoidal waveforms of slightly different damping factors, the difference will reach a maximum value somewhere between zero time and the time to decay to zero voltage. This maximum value will occur at a time in the range between the two time constants of the waveforms. Thus, the difference voltage V5 will reach a maximum in the time region between the two time constants 8 milliseconds and 10 milliseconds.

If the 10 millisecond time constant peak voltage represents a reference for an acceptable neutral-to-grounding resistance, it can be seen that an increase in the neutral-to-grounding resistance of 3 ohms (i.e. 15-12) has produced a shift in the waveforms V2, V2' from a value of 40 volts at 9 milliseconds to a value of 32 volts. This difference of 8 volts represents a voltage change of over 2.5 volts per ohm, a reduction of twenty percent.

When coupled to the grounding to neutral circuit of a power distribution system, the frequency of the resonant circuit is a critical factor in the monitoring apparatus' performance. Errors in detecting the damping effect of the neutral-grounding resistance coupled to the resonant circuit can arise from the inductive reactance of the neutral-grounding path or by losses which appear as resistance in series with the neutral conductor because of transformer coupling action between the neutral conductor and other wires or conductors which may be carried in the same conduit. These errors are frequency dependent. It has been found that the frequency of the resonant circuit should be no higher than approximately 3000 hertz in order to reduce these errors to a negligible level.

In order to meet the 3.5 milliampere leakage current limit, a capacitor connected between the neutral and grounding conductors should not be greater than approximately 0.05 microfarads. This is to keep the 60 hertz power line frequency impedance greater than approximately 35,000 ohms.

To minimize errors which may arise from neutral to grounding voltage which may range from 6–10 volts, it is desirable to use the highest practical charge voltage for exciting the resonant circuit. A value of approximately 100 volts has been found to be satisfactory. The upper safety limit of voltage on a capacitor that may be discharged from a neutral conductor through the grounding conductor is based on the physiological data for a "one-time" capacitor discharge current through the human body that is below the value that will cause ventricular fibrillation in an adult person. Since this discharge current limit is both magnitude and time dependent, the voltage limit is dependent upon the size of the capacitor. In the preferred grounding to neutral resistance monitoring means shown here, the capacitor size is chosen to satisfy the electric shock hazard resulting from leakage current that might flow through a person if the neutral and hot conductors were interchanged at the outlet receptacle. The limit of this current is 3.5 milliamperes R.M.S. This limits the capacitor size to about 0.05 microfarads in a 120 volt, 60 hertz electrical supply. However, the device must also comply with the "one-time" capacitor discharge limit. Because of involuntary reaction to withdraw from contact with objects causing electric shock, the safety standards consider any repetition of the shock that occurs after an elapsed time of one second to be equivalent to a one-time event.

The charging voltage on the capacitor used in the means shown is of the order of 100 volts, a value that is considerably below the maximum value allowed for the capacitor employed in the resonant circuit. However, the one-second interval for repeating the discharge must be maintained. That is why the monitoring of the neutral to grounding conductor resistance is performed at intervals of slightly greater than one second. The result of each monitoring test is preserved until the next test, approximately one second later.

To meet both the frequency and current leakage requirements discussed, a resonant circuit with an inductor of 60 millihenries in series with a capacitor of 0.05 microfarads may be used. However, in order for the resonant circuit to be sufficiently sensitive to small changes in neutral to grounding resistance, it is important that the effective resistance of the resonant circuit be no more than about 10 times the resistance of a neutral to grounding circuit having an acceptable predetermined resistance value (1 ohm in the assumed circuit). If the resistance-causing losses of both the capacitor and the inductor are sufficiently low, that is, a circuit Q of approximately 100, the effective series resistance of the inductor and capacitor of the resonant circuit will be approximately 10-12 ohms.

While the cost of LC components having an effective resistance of less than about 10 ohms becomes excessive, there exist high quality, cost effective components which have an effective resistance of 10-12 ohms. Preferably, the resonant circuit of the apparatus 10 may include a gapped ferrite core inductor, part no. RM10PA400-3B9, manufactured by Phillips, and a polypropylene capacitor, part no. 473MPR400k, manufactured by Illinois Capacitor. When these components are used, the resonant circuit has an effective resistance of about 11 ohms. If the neutral-grounding resistance is at an acceptable value of approximately 1 ohm, the time constant of a resonant with these preferred components circuit is 10 milliseconds (i.e. $2 \cdot (60 \times 10^{-3}$ henries$)/(12$ ohms$)$).

FIG. 11

Figure 11:
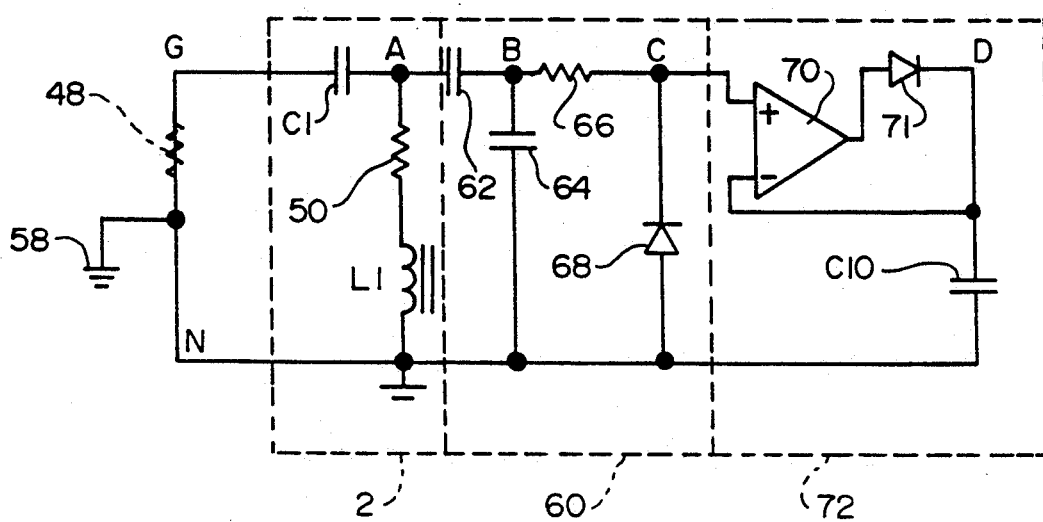
FIG. 11 is a schematic diagram of a circuit for sampling the waveform of a resonant circuit.

In the following discussion, reference to both FIGS. 1 and 11 will be made concurrently. FIG. 11 shows an equivalent circuit 2 for a series LC circuit constituting the preferred resonant circuit 2 and its effective resistance 50, an exemplary waveform-inverting circuitry 60 and peak detecting circuit 72. The circuits 60 and 72 including the sampling means 5 and the comparison means 6 shown in FIG. 1.

The resonant circuit 2 may include a 0.05 microfarad capacitor C1 coupled to the grounding conductor G and an 11 ohm effective resistance 50 and a 60 millihenry inductor L1 coupled between the resistance 50 and the neutral conductor N. The grounding and neutral conductors have a common earth ground 58. The normal acceptable resistance of the neutral conductor to grounding conductor circuit is assumed to be 1 ohm. It is shown as a resistance 48 in FIG. 11. V1 in FIG. 3 shows the sinusoidal voltage waveform at point A of the resonant circuit 2 having an initial value of 100 volts placed on the capacitor C1 at zero time by a charging circuit not shown in FIG. 11.

Figure 12:
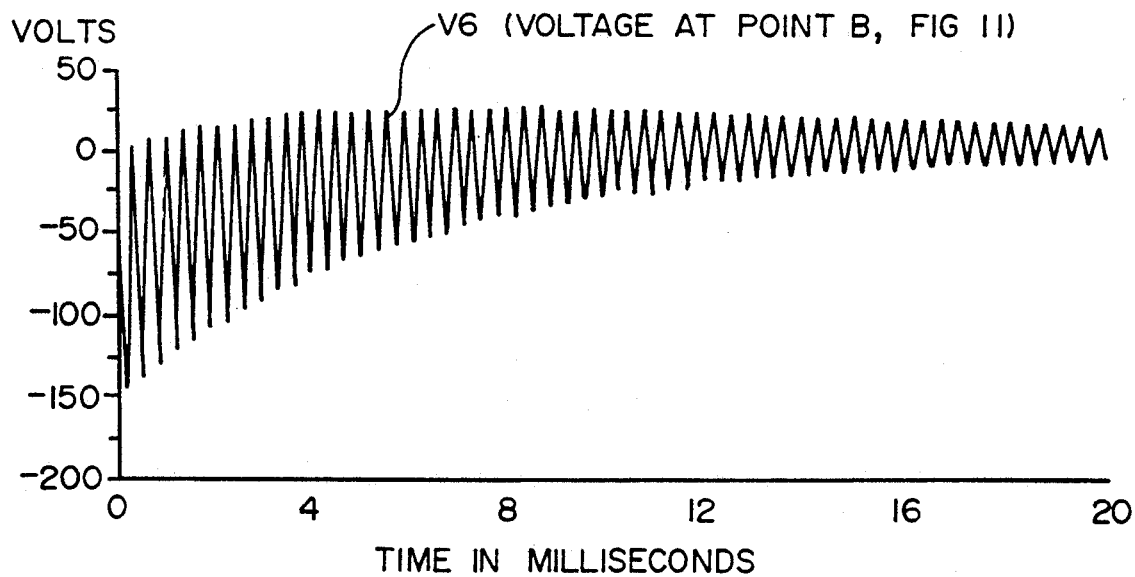
FIG. 12 is the voltage at point B in the circuit of FIG. 11.

The coupling, or waveform modifying circuit 60 includes a 0.003 microfarad capacitor 62 coupled between the junction of capacitor C1 and resistance 50 of the resonant circuit 2 and a 0.001 microfarad capacitor 64. The capacitor 64 is also coupled to the neutral conductor N which acts as a chassis ground for the sampling circuit. A 1.3 megaohm resistor 66 is coupled between the juncture of capacitors 62, 64 and the cathode of a shunt diode 68. The anode of the diode 68 is coupled to the neutral conductor N. The time constant of the waveform modifying circuit 60 combined with the impedance values of the resistor 66 and diode 68, converts the damped sinusoidal voltage waveform V1 at point A into a waveform V6 at point B shown in FIG. 12. A charge of 100 volts is initially placed on the left-hand side of the 0.003 microfarad capacitor 62. Thus, the waveform V6 has maximum peak values that begin near zero voltage and reach a greatest value of just over 20 volts in the range between 8 and 10 milliseconds. The combination of the decay rate of the voltage sinusoidal waveform V1 and the time constant of the coupling circuit forces the maximum peak values of the waveform V6 to have the greatest value in the vicinity of one time constant of the resonant circuit 2 combined with the external grounding to neutral conductor circuit.

The peak detector circuit 72 includes an operational amplifier 70 having a non-inverting terminal coupled between the resistor 66 and cathode of the diode 68 of the waveform modifying circuit 60. The output terminal of amplifier 70 is coupled to the anode of a diode 71. The cathode of the diode 71 is coupled to a 1.0 microfarad capacitor C10 which is in turn coupled to the neutral conductor N. The 0.001 microfarad capacitor 64 reduces the peak amplitude of the input voltage V6 to the operational amplifier 70 of the peak detector circuit 72 to a safe operating value for the operational amplifier 70.

FIG. 13 shows the input voltage waveform V7 to the operational amplifier at point C. The output voltage V8 at point D is shown in FIG. 14.

Figure 15:
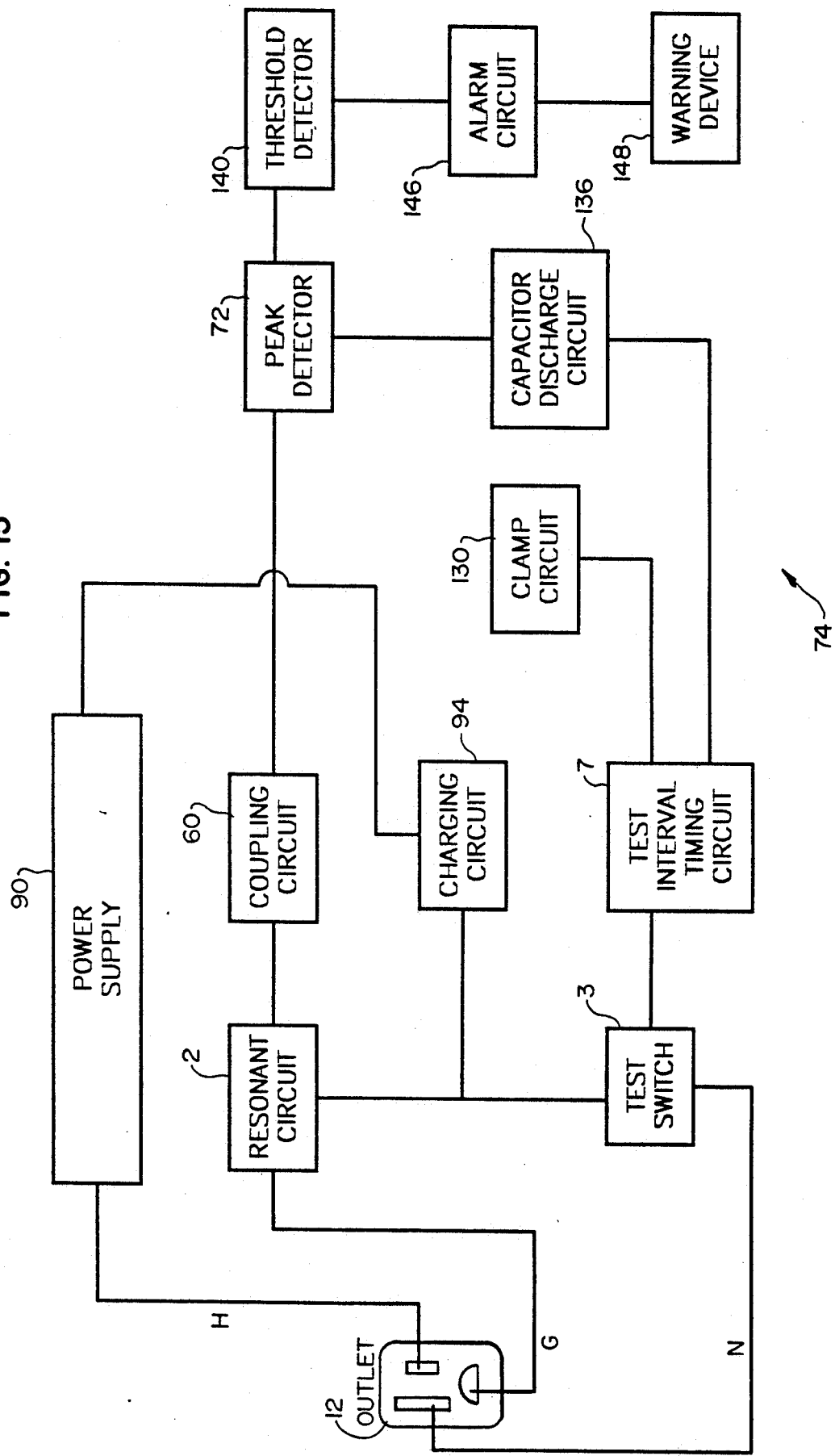
FIG. 15 is a block diagram of a complete grounding-neutral monitoring apparatus.

FIGS. 15 and 16

A block diagram 74 of a complete neutral-grounding resistance monitoring unit 10 is shown in FIG. 15. FIG. 16 shows a schematic diagram of a preferred circuit 76 which implements the blocks in FIG. 15. In the following discussion, reference to both FIGS. 15 and 16 will be made concurrently. Dashed lines around portions of the circuit 76 correspond with the blocks shown in FIG. 15. The circuit 76 includes the sampling circuit discussed previously.

An outlet 12 (shown in FIG. 2) provides access to the hot conductor 4, neutral conductor N and grounding conductor G of a power distribution system branch circuit. A resonant circuit 2 comprising a 0.05 microfarad capacitor C1 and a 60 millihenry inductor L1 is coupled between the grounding and neutral conductors G,N. The neutral conductor N acts as the chassis ground for the unit 10.

A power supply 90 coupled to the hot conductor H of the outlet 12 provides power to a charging circuit 94. The charging circuit 94 provides a regulated voltage supply to charge the capacitor C1 so that a decaying voltage sinusoidal waveform will have a precise initial peak value. Line voltage, from the hot conductor H, charges capacitor C2 through a resistor R1 and a diode D1 to a value 7.5 volts higher than the zener voltage of diode D2 of 91 volts. A resistor R2 is coupled between the capacitor C2 and diode D2. The non-inverting input 96 of a regulating operational amplifier IC1 is referenced to 6.2 volts derived from a precision temperature compensated zener diode D3. A voltage divider comprising resistances R3, R4 and R5 applies a sample of the output voltage of the operational amplifier IC1 to an inverting input 98. The voltage division is such that the output voltage of the operational amplifier IC1 is about half of its 15 volt supply. This voltage is added to the voltage across zener diode D2. With the operational amplifier's gain set to about 100 by resistors R3 and R6, the regulated voltage output is maintained with adequate precision at about 98 volts. The resonating capacitor C1 is charged through a resistor R7 and the inductor L1.

The power supply circuit 90 includes a capacitor C3 and diodes D4 and D5 which provide a 15 volt positive supply. Regulation is provided by a zener diode D6. A capacitor C4 of timing circuit 7 and a resistor R8 provide a timing interval for shock exciting the resonant circuit 80. A potentiometer R9 allows the interval to be adjusted from 1.0 to 2.0 seconds. The capacitor C4 also supplies holding current for a test switch 104. The test switch 104 includes a triac switch 3 constituting the switch 3 shown in FIG. 1. A resistor R10 sets a holding interval which is of the order of 100 milliseconds. A diode D7 gates the discharge current of capacitor C4 through the triac switch 3 which closes the resonant circuit 2 and conducts the oscillating current of the resonant circuit 2. The capacitor C4 and resistor R8 thus provide about a 1.5 second timing interval by functioning as a relaxation oscillator with the triac switch 3, which, at the time it turns on, discharges the capacitor C4 and shock excites the resonant circuit 2.

To minimize the effects of neutral to grounding voltage, it is desirable to initiate the damped sinusoidal waveform at a power-line zero-crossing. This is accomplished by a 4093 two-input NAND Schmitt trigger IC2. One input 110 is coupled to the hot conductor H through a resistor R11. Line disturbances are filtered by a capacitor C5. The second input 112 is coupled to the potentiometer R9. Firing of the triac switch 3 is initiated by the first negative-going zero-crossing of the hot conductor line voltage at about plus 7 volts after the exponentially increasing voltage level set by the potentiometer R9 reaches the trigger threshold of the NAND trigger IC2. This causes the output of the NAND trigger IC2 to go high and drive a transistor Q2 into conduction. The triac switch 3 is then triggered through a resistor R12. A diode D8 prevents a negative going pulse from breaking down the base-emitter junction of the transistor Q2 and triggering the triac switch 3. The sharp differentiation of the output 114 from NAND trigger IC2 provided by a capacitor C6 and the input impedance of transistor Q2 assures that the triac switch 3 will be triggered only near the zero-crossing.

A coupling or waveform modifying circuit 60 comprising two capacitors C7 and C8, a resistor R13 and a diode D9 is used to sample the damped sinusoidal voltage waveform of the resonant circuit 80. As described earlier, the coupling circuit 60 converts the damped voltage sinusoidal waveform of the resonant circuit 2 to the form shown in FIG. 12.

A peak detector circuit 72 detects the peak voltage of the damped sinusoidal waveform in the region of one time constant by operational amplifiers IC3 and IC4. It is desirable to sample the decaying sinusoidal waveform for as short an interval as possible in order to avoid any output to the peak detector circuit 72 from noise or transients that might occur during the long interval between samples. The timing of the circuit is such that the damped sinusoidal voltage waveform is sampled in the vicinity of the next zero crossing of the line voltage. It is also necessary to suppress a fairly large positive pulse that occurs shortly after the sample is taken, which results from the triac switch 3 switching off when the current supplied by capacitor C4 falls below its holding level. For these purposes, a clamp circuit 130 is provided. The clamp circuit includes a transistor Q3 a resistor R14, and a capacitor C9. The transistor Q3 is held in conduction by current through R14 until the beginning of the test or interval. When the triac switch 3 conducts, Q3 is turned off by a negative pulse applied through capacitor C9 which is coupled between the transistor Q3 and the switch 2. The capacitor C9 was previously charged positive along with capacitor C4. The capacitor C9 and input impedance of Q3 form a time constant which releases the clamp long enough to sample the damped sinusoidal voltage waveform but short enough to clamp the positive pulse that occurs when the triac switch 3 shuts off.

A capacitor C10 coupled to operational amplifier 70 in the peak detector circuit 72 would eventually be charged to almost the supply voltage because of input bias current which flows out of the operational amplifier's inverting input terminal 134. Therefore, it is necessary to discharge the capacitor C10 prior to detecting the peak voltage. A capacitor discharging circuit 136 which include a transistor Q4 is provided for this function. The transistor Q4 is driven into conduction by the triac switch's trigger source voltage from transistor Q2. This allows the capacitor C10 to discharge through a resistor R15 and the transistor Q4.

Operational amplifier IC4 acts as a buffer between the output of operational amplifier IC3 and a threshold detecting circuit 140. To eliminate the effect of the brief voltage drop from the discharging action of capacitor C10, the output of operational amplifier IC4 is filtered by a resistor R16 and a capacitor C11. The peak detector circuit 72 is of sufficiently low drift that the input voltage to the threshold detector circuit 140 remains steady during the 1.5 seconds between test intervals. Potentiometer R15 coupled between the peak detector 124 and threshold detector 140 sets the threshold limit level for the grounding-neutral resistance that represents the high limit at which an alarm circuit 146 will be activated. A level of 1.5 to 2 ohms is preferred.

The output of the peak detector circuit 72 is applied to the non-inverting input of operational amplifier IC5 which acts as a comparator that sets the warning threshold level. A reference voltage for the operational amplifier IC5 is derived from the 6.2 volt precision zener diode D3 and is applied to the inverting input 142 of the operational amplifier IC5 through a resistor R18. As long as the non-inverting input 144 to operational amplifier IC5 is greater than the reference voltage, the output 145 of the operational amplifier IC5 will remain high. If the grounding to neutral resistance rises above the threshold value, the output 145 will go low. Thermistor R19 and resistor R18 provide compensation for variance in the voltage of the resonant circuit 80 with temperature. Resistor R18 is chosen so that the resistance variation of the thermistor R19 with temperature causes the reference voltage to track the change in the output of the peak detector that results from the temperature characteristic of the resonant circuit 2.

The operational amplifier IC5 output going low drives a warning light emitting diode indicator 18a. An audible warning piezo buzzer 148 is driven by a NAND Schmitt trigger IC6 configured as a square waveform generator with a resistor R20 and a capacitor C12. Similarly, another NAND Schmitt trigger IC7 provides a pulsed warning signal with a resistor R21 and a capacitor C13. Warning sound activation is controlled by a transistor Q5 which inverts the output of operational amplifier IC5 which causes the transistor Q5 to become non-conducting when the operational amplifier IC5 goes low, thus activating the piezo buzzer drivers. Resistors R22 and R23 couple the transistor to the operational amplifier IC5 and the chassis ground.

An alternative embodiment of this circuit 76 may include a surge suppression circuit 150. A first metal oxide varistor 151 coupled between the hot conductor H and neutral conductor 86, a second metal oxide varistor 152 coupled between the hot conductor 84 and grounding conductor G, and a third metal oxide varistor 154 coupled between the grounding conductor G and neutral conductor N can be utilized as the surge suppression circuit 150. The metal oxide varistors are preferably 150 volts rms, 80 Joules (G.E. No. V150 LA 20).

Components of the elements of the circuit 76 are as follows:

| Resistors | (ohms) | Capacitors | (Farads) | Diodes | (Type) |
|---|---|---|---|---|---|
| R1 | 10K | C1 | 0.05μ | D1 | IN4005 |
| R2 | 10K | C2 | 4.7μ | D2 | IN4763 |
| R3 | 100 | C3 | 1μ | D3 | IN821 |
| R4 | 10K | C4 | 220μ | D4 | IN4005 |
| R5 | 150K | C5 | 33pico | D5 | IN4005 |
| R6 | 10K | C6 | .01μ | D6 | IN4744 |
| R7 | 100K | C7 | .003μ | D7 | IN4005 |
| R8 | 2200 | C8 | .001μ | D8 | IN4005 |
| R9 | 50K | C9 | 1μ | D9 | IN4005 |
| R10 | 68 | C10 | 1μ | D10 | IN4005 |
| R11 | 1M | C11 | 3.3μ | 18a | Red L.E.D. |
| R12 | 330 | C12 | .01μ | D12 | IN4005 |
| R13 | 1.3 | C13 | 10μ | | |
| R14 | 47K | C14 | 1000μ | | |
| R15 | 1K | | | | |
| R16 | 470K | | | | |
| R17 | 50K | | | | |
| R18 | 1.8K | | | | |
| R19 | Thermistor | | | | |
| R20 | 100K | | | | |
| R21 | 100K | | | | |
| R22 | 2.2K | | | | |
| R23 | 22K | | | | |
| R24 | 3.3K | | | | |
| R25 | 3.3K | | | | |
| R26 | 10K | | | | |
| IC | (type #) | O | | (type #) | |
| IC1 Op Amp | LM324 | 3 Triac Switch | | Q201E4 | |
| IC2 NAND | 4093 | Q2 Transistor | | 2N4401 | |
| IC3 Op Amp | LM324 | Q3 Transistor | | 2N4401 | |
| IC4 Op Amp | LM324 | Q4 Transistor | | 2N4401 | |
| IC5 Op Amp | LM324 | Q5 Transistor | | 2N4401 | |
| IC6 NAND | 4093 | | | | |
| IC7 NAND | 4093 | | | | |

While the invention has been described with reference to a preferred embodiment, it will be understood by those skilled in the art that various changes may be made and equivalents may be substituted for elements thereof without departing from the broader aspect of the invention. Also, it is intended that broad claims not specifying details of a particular embodiment disclosed herein as the best mode contemplated for carrying out the invention should not be limited to such details. Furthermore, while, generally, specific claimed details of the invention constitute important specific aspects of the invention in appropriate instances even the specific claims involved should be construed in light of the doctrine of equivalents.

What is claimed is:

1. A method of continuously monitoring the resistance in a grounding conductor to neutral conductor circuit in a power distribution system including a grounding conductor, a neutral conductor and a hot conductor comprising the steps of:

providing a resonant circuit coupled to said grounding conductor and said neutral conductor;

periodically charging said resonant circuit with electrical energy derived from said hot conductor;

periodically discharging the energy in said resonant circuit through said grounding conductor to said neutral conductor circuit at said outlet to produce a damped sinusoidal waveform;

periodically sampling a given parameter of each such waveform which is responsive to a resistance in said grounding to neutral conductor circuit;

periodically comparing said parameter of each waveform to a similar parameter of a predetermined waveform which would be produced by said resonant circuit discharging into an external circuit with a predetermined limit resistance; and indicating a grounding conductor to neutral conductor circuit resistance value which is greater than said predetermined limit resistance.

2. The method of claim 1 wherein said hot and neutral conductors have an AC voltage applied thereto, said electrical energy being a fixed regulated DC voltage derived from said AC voltage, and said shock excitation and sampling steps are carried out when the AC voltage is at or passing through zero.

3. The method of claim 1 wherein said sampled parameter is a measure of the amplitude of each waveform at a constant predetermined time from the beginning of each waveform.

4. The method of claim 3 wherein the overall circuit comprising said resonant circuit and said grounding conductor to neutral conductor circuit has a given time constant when said resistance has said predetermined limit resistance, and said predetermined time is at or near the vicinity of one time constant at which time variations in waveform amplitude is most sensitive to resistance variations.

5. An apparatus for continuously monitoring the resistance of a grounding conductor to neutral conductor circuit in a power distribution system including a grounding conductor, a neutral conductor, and a hot conductor comprising:

a resonant circuit coupled to said grounding conductor and said neutral conductor;

a shock-exciting circuit coupled to said hot conductor for periodically charging said resonant circuit with electrical energy and allowing said energy to decay in a damped sinusoidal waveform;

a sampling circuit and a timing circuit coupled to said resonant circuit for periodically sampling a parameter of each said waveform responsive to an eternally added resistance of said grounding conductor to neutral conductor circuit;

a comparison circuit coupled to said sampling circuit for periodically comparing said parameter of each said sampled waveform at a predetermined sampling time in said decay of each of said waveforms with a parameter of a predetermined waveform produced by said resonant circuit when the external resistance measured between said grounding and neutral conductors is a predetermined limit value; and an indicating circuit responsive to said comparison circuit for indicating an undesired resistance in said grounding conductor to neutral conductor circuit which exceeds said limit value.

6. The apparatus of claim 5 wherein sad sampled parameter is a measure of the amplitude of each waveform at a predetermined time from the beginning of each waveform.

7. The apparatus of claim 6 combined with said grounding, neutral and hot conductors, there being an Ac voltage across said hot and neutral conductors, and said resonant circuit includes a capacitor, and a voltage regulated DC power supply coupled across said hot and neutral conductors to provide a fixed DC voltage, means cyclically coupling said DC voltage across said capacitor to establish a predetermined voltage charge on said capacitor, said shock-exciting circuit including a timing circuit for cyclically discharging said capacitor through the rest of said resonant circuit and said grounding and neutral conductors.

8. The apparatus of claim 7 wherein the resonant circuit includes a capacitor of a given value charged to a given voltage and in which the value of the capacitance for the applied voltage complies with the limits set by a recognized safety testing agency for a "one-time" capacitor discharge that will not result in an electrical shock safety hazard.

9. The apparatus of claim 7 wherein said timing circuit operates to allow the predetermined voltage charge on said capacitor to begin to decay at a time when said AC voltage is at or near zero.

10. The apparatus of claim 9 wherein sad timing circuit operates so that said predetermined time is at or near a time said AC voltage is at or near zero.

11. The apparatus of claim 10 wherein said damped sinusoidal waveform has an initial maximum peak of greatest value followed by consecutive maximum peaks of progressively lesser value.

12. The apparatus of claim 11 wherein said sampling circuit includes a waveform modifying circuit which converts said damped sinusoidal waveform into a second modified waveform having one initial peak at or near zero followed by corresponding consecutive maximum peaks of progressively greater value which reach a greatest value at or near one time constant of said resonant circuit followed by consecutive maximum peaks of progressively lesser value.

13. The apparatus of claim 12 wherein said sampling circuit further comprises a peak detector circuit which stores the greatest value of said modified waveform and said comparison circuit compares said stored greatest value with a value which would be produced by said waveform modifying circuit if said resistance measured between said grounding and neutral conductors is said predetermined limit value, and wherein said comparison circuit comprises a threshold detector circuit which provides an output signal coupled to said indicating circuit for indicating if said grounding conductor to neutral conductor circuit resistance is greater than said predetermined limit value.

14. The apparatus of claim 13 wherein said threshold detector circuit includes an operational amplifier having a non-inverting terminal coupled to the stored output of said peak detector circuit, through a potentiometer which sets said predetermined resistance value and an inverting terminal coupled to a reference voltage.

15. The apparatus of claim 6 wherein said resonant circuit and the grounding to neutral conductor circuit when having a normal acceptable resistance has a given time constant, and said predetermined time is at or near the vicinity of one said time constant when variations in waveform amplitude is most sensitive to resistance variations.

16. The apparatus of claim 5 wherein said resonant circuit has a frequency of no greater than about 3000 hertz.

17. The apparatus of claim 5 wherein said resonant circuit has a frequency at least many times greater than 60 hertz and low enough to reduce the effects of inductive reactance of the grounding to neutral conductors to a value which is a small fraction of the value of the resistance to be monitored so as not to substantially affect the accuracy of the resistance to be indicated.

18. The apparatus of claim 5 wherein said resonant circuit has a frequency low enough so that transformer action caused by magnetic coupling between the neutral conductor and other conductors contained in the same conduit will not introduce series equivalent resistance into the neutral conductor greater than a small fraction of the value of the resistance to be monitored so as not to substantially affect the accuracy of the external resistance indicated.

19. The apparatus of claim 5 wherein the resonant circuit includes a capacitor small enough to limit the leakage current between the neutral and grounding conductors to a given safe value acceptable to a recognized safety testing agency, said leakage current resulting from the interchange of the hot and neutral conductors at the power outlet.

20. The apparatus of claim 5 wherein the time interval between shock excitations of the resonant circuit are long enough to comply with the time intervals required by a recognized safety testing agency to qualify the capacitor discharge as a "one-time" event.

21. The apparatus of claim 5 wherein the resonant circuit has an effective resistance not more than about 10 times said predetermined limit value of said external resistance.

22. The apparatus of claim 5 wherein the resonant circuit has an effective resistance which is no greater than about 10 times the difference between a reference acceptable resistance and the limit resistance value to be monitored.

23. An apparatus for testing the resistance of a given circuit between a pair of test terminals, comprising:
  a resonant circuit coupled between said terminals;
  a circuit coupled to said resonant circuit for shock exciting said resonant circuit with electrical energy to produce a damped sinusoidal waveform responsive to the resistance between said terminals and allowing said waveform to decay;
  a circuit for sampling said decaying waveform and having a waveform modifying circuit which converts said decaying waveform into a second waveform having a maximum value at a time approximately equal to one time constant of said resonant circuit from the beginning of said decaying waveform;
  a circuit for comparing said maximum value with a predetermined value; and
  a circuit responsive to said comparing circuit for indicating when the resistance between said terminals has a given relationship to said predetermined value, said damped sinusoidal waveform having an initial maximum peak of greatest value followed by consecutive maximum peaks of progressively lesser value.

24. The apparatus of claim 23 wherein said waveform modifying circuit converts said damped sinusoidal waveform into a second waveform having an initial maximum peak at or near zero followed by consecutive maximum peaks of progressively greater value which reach a greatest value at or near one time constant of said resonant circuit followed by consecutive maximum peaks of progressively lesser value, and wherein said sampling circuit further comprises a peak detector circuit including an operational amplifier having a non-inverting terminal coupled to said waveform modifying circuit for detecting said maximum peak having said greatest value of said second waveform and outputting said greatest value.

25. The apparatus of claim 24 wherein said comparing circuit comprises a threshold detector circuit including an operational amplifier having a non-inverting terminal coupled to an output of said peak detector circuit through a potentiometer which sets said predetermined limit resistance and an inverting terminal coupled to a reference voltage, said threshold detector circuit providing an output signal coupled to said indicating circuit value of said resistance.

* * * * *